Sept. 29, 1970 MASAMITSU NISHIDA ET AL 3,531,412

PIEZOELECTRIC CERAMIC COMPOSITIONS

Filed Aug. 16, 1968

Masamitsu Nishida & Hiromu Ouchi

INVENTORS

BY Wenderoth, Lind & Ponack

ATTORNEYS

United States Patent Office 3,531,412

Patented Sept. 29, 1970

3,531,412

PIEZOELECTRIC CERAMIC COMPOSITIONS

Masamitsu Nishida and Hiromu Ouchi, Toyonaka-shi, Osaka-fu, Japan, assignors to Matsushita Electric Industrial Co., Ltd., Kadoma, Osaka, Japan Filed Aug. 16, 1968, Ser. No. 753,087
Claims priority, application Japan, Aug. 21, 1967, 42/54,167
Int. Cl. C04d *35/00;* H01v *7/02*
U.S. Cl. 252—62.9 4 Claims

ABSTRACT OF THE DISCLOSURE

Ceramic materials within particular ranges of the ternary system $Pb(Cu_{1/4}Nb_{3/4})O_3$—$PbTiO_3$—$PbZrO_3$ in solid solution-form exhibit high dielectric constant along with high planar coupling coefficient, and are useful in electromechanical transducers. The ceramic materials are those within the area A, B, C, D, and E and the area F, G, H, I, J, K and L of FIG. 2.

This invention relates to piezoelectric ceramic compositions and articles of manufacture fabricated therefrom. More particularly, the invention pertains to novel ferroelectric ceramics which are polycrystalline aggregates of certain constituents. These piezoelectric compositions are sintered to ceramics by ordinary ceramic techniques and thereafter the ceramics are polarized by applying a D-C voltage between the electrodes to impart thereto electromechanical transducing properties similar to the well known piezoelectric effect. The invention also encompasses the calcined product of raw ingredients and the articles of manufacture such as electromechanical transducers fabricated from the sintered ceramic.

The ceramic bodies materialized by the present invention exist basically as the ternary system $$Pb(Cu_{1/4}Nb_{3/4})O_3—PbTiO_3—PbZrO_3$$

in solid solution form.

The use of piezoelectric materials in various transducer applications in the production, measurement and sensing of sound, shock, vibration, pressure, etc. has increased greatly in recent years. Both crystal and ceramic types of transducers have been widely used. But, because of their potentially lower cost and facility in the fabrication of ceramics with various shapes and sizes and their greater durability for high temperature and/or for humidity than that of crystalline substances such as Rochelle salt, piezoelectric ceramic materials have recently achieved importance in various transducer applications.

The piezoelectric characteristics of ceramics required apparently vary with species of applications. For example, electromechanical transducers such as phonograph pick-ups, microphones and voltage generators in ignition systems require piezoelectric ceramics characterized by a substantially high electromechanical coupling coefficient and dielectric constant. On the other hand, it is desired in filter applications of piezoelectric ceramics that the materials exhibit a high stability with temperature and time in resonant frequency and in other electrical properties.

As more promising ceramics for these requirements, lead titanate-lead zirconate is in wide use up to now. However, it is difficult to get a high dielectric constant along with high planar coupling coefficient in the lead-titanate-lead zirconate ceramics. And the dielectric and piezoelectric properties of the lead titanate-lead zirconate ceramics change greatly with firing technique which is ascribable to evaporation of PbO.

It is, therefore, the fundamental object of the present invention to provide novel and improved piezoelectric ceramic materials which overcome the problems outlined above. A more specific object of the invention is to provide improved polycrystalline ceramics characterized by high dielectric constant along with high piezoelectric coupling coefficient.

Another object of the invention is the provision of novel piezoelectric ceramic compositions, certain properties of which can be adjusted to suit various applications.

Still another object of the invention is the provision of improved electromechanical transducers utilizing, as the active elements, an electrostatically polarized body of the novel ceramic compositions.

A further object of the invention is to provide novel piezoelectric ceramics characterized by high planar coupling coefficient at relatively high temperature.

These objects of the invention and the manner of their attainment will be readily apparent from a reading of the following description and from the accompanying drawing, in which.

Figure 1:
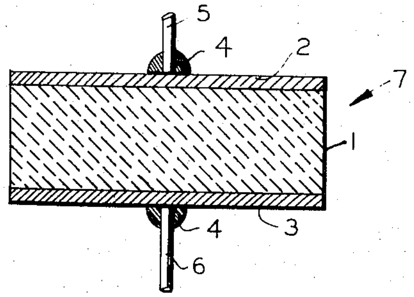
FIG. 1 is a cross-sectional view of an electromechanical transducer embodying the present invention.

Before proceeding with a detailed description of the piezoelectric materials contemplated by the invention, their application in electromechanical transducers will be described with reference to FIG. 1 of the drawings wherein reference character 7 designates, as a whole, electromechanical transducer having, as its active element, a preferably disc shaped body 1 of piezoelectric ceramic material according to the present invention.

Body 1 is electrostatically polarized, in a manner hereinafter set forth, and is provided with a pair of electrodes 2 and 3, applied in a suitable and per se conventional manner, on two opposed surfaces thereof. Wire leads 5 and 6 are attached conductively to the electrodes 2 and 3 respectively by means of solder 4. When the ceramic is subjected to shock, vibration or other mechanical stress, an electrical output generated can be taken from wire leads 5 and 6. Conversely, as with other piezoelectric transducers, application of electrical voltage to electrodes 5 and 6 will result in mechanical deformation of the ceramic body. It is to be understood that the term electromechanical transducer as used herein is taken in its broadest sense and includes piezoelectric filters, frequency control devices, and the like, and that the invention can also be used and adapted to various other applications requiring materials having dielectric, piezoelectric and/or electrostrictive properties.

According to the present invention, the ceramic body 1, FIG. 1 is formed of novel piezoelectric compositions which are polycrystalline ceramics composed of $$Pb(Cu_{1/4}Nb_{3/4})O_3—PbTiO_3—PbZrO_3$$

The present invention is based on the discovery that within particular ranges of this system the specimens exhibit a high dielectric constant along with high planar coupling coefficient.

The present invention has various advantages in manufacturing process and in application for ceramic transducers. It has been known that the evaporation of PbO during firing is a problem in sintering of lead compounds such as lead titanate-zirconate. The invented composition, however, shows a smaller amount of evaporated PbO than usual lead titanate-zirconate does. The invented compositions can be fired without any particular control of PbO atmosphere. A well sintered body of the present composition is obtained by firing in a ceramic crucible with a ceramic cover made of $Al_2O_3$ ceramic. A high sintered density is desirable for humidity resistance and high piezoelectric response when the sintered body is applied to a resonator, etc.

Figure 2:
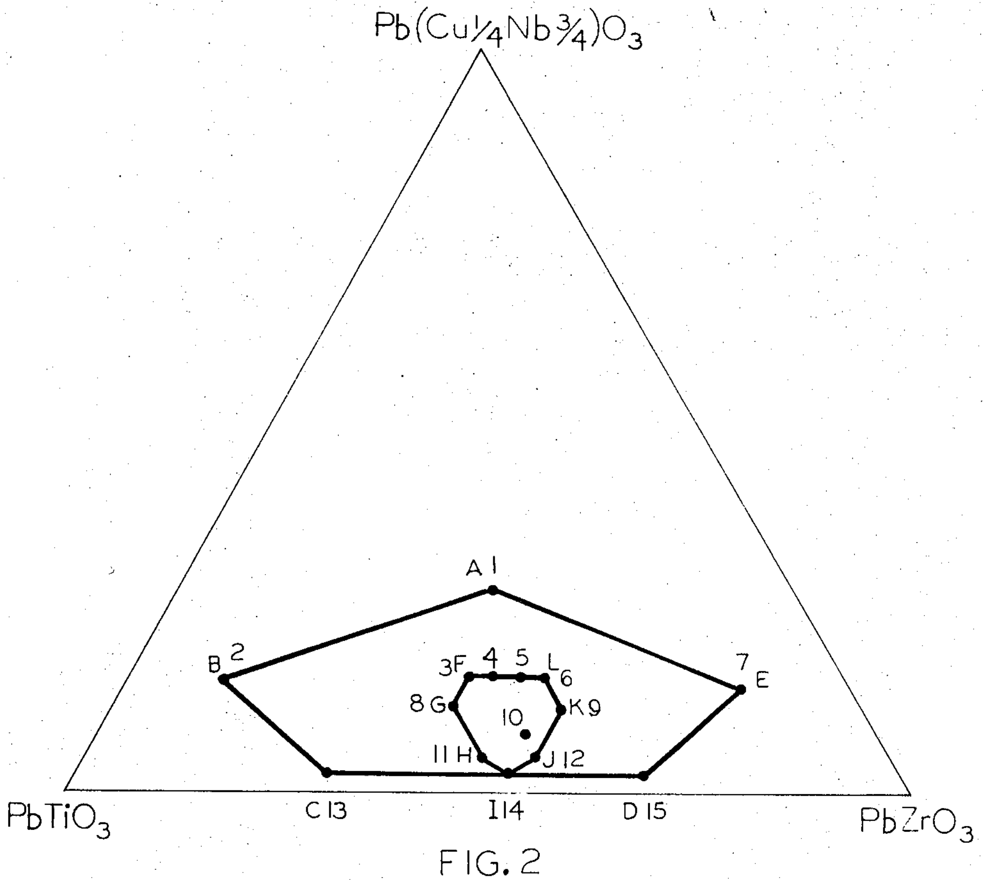
FIG. 2 is a triangular compositional diagram of materials utilized in the present invention.

All possible compositions coming within the ternary system $Pb(Cu_{1/4}Nb_{3/4}O_3$—$PbZrO_3$—$PbZrO_3$ are represented by the triangular diagram constituting FIG. 2 of the drawings. Some compositions represented by the diagram, however, do not exhibit high piezoelectricity and high dielectric constant. Many are electromechanically active only to a slight degree and show low dielectric constant. The present invention is concerned only with those compositions exhibiting high dielectric constant and piezoelectric response of appreciable magnitude. As a matter of convenience, the planar coupling coefficient ($K_p$) of test discs will be taken as a measure of piezoelectric activity. Thus, within the area bounded by lines connecting points A, B, C, D and E, FIG. 2, all compositions polarized and tested showed a planar coupling coefficient of approximately 0.20 or higher. The compositions in the area of the diagram bounded by lines connecting points F, G, H, I, J, K and L, FIG. 2, exhibit a planar coupling coefficient of approximately 0.50 or higher. The molar percent of the three components of compositions ABCD EFGHIJKL are as follows:

| | $Pb(Cu_{1/4}Nb_{3/4})O_3$ | $PbTiO_3$ | $PbZrO_3$ |
|---|---|---|---|
| A | 25.0 | 37.5 | 37.5 |
| B | 12.5 | 75.0 | 12.5 |
| C | 1.0 | 69.0 | 30.0 |
| D | 1.0 | 29.0 | 70.0 |
| E | 12.5 | 12.5 | 75.0 |
| F | 12.5 | 46.5 | 41.0 |
| G | 9.0 | 50.0 | 41.0 |
| H | 3.0 | 50.0 | 47.0 |
| I | 1.0 | 47.0 | 52.0 |
| J | 3.0 | 43.0 | 54.0 |
| K | 8.5 | 37.5 | 54.0 |
| L | 12.5 | 37.5 | 50.0 |

Furthermore, the compositions near the morphotropic phase boundary of the ternary system, particularly $$Pb(Cu_{1/4}Nb_{3/4})_{0.125}Ti_{0.435}Zr_{0.440}O_3$$

and $$Pb(Cu_{1/4}Nb_{3/4})_{0.060}Ti_{0.430}Zr_{0.510}O_3$$

give ceramic products having a planar coupling coefficient of 0.60 or higher.

According to the present invention, piezoelectric and dielectric properties of the ceramics can be adjusted to suit various applications by selecting the proper composition.

The compositions described herein can be prepared in accordance with various well known ceramic procedures. An advantageous method, however, hereinafter more fully described, consists in the use of $PbO$ or $Pb_3O_4$, $Cu_2O$ or $CuO$, $Nb_2O_5$, $TiO_2$, $ZrO_2$.

The starting materials, viz., lead oxide ($PbO$), cupric oxide ($CuO$), niobia ($Nb_2O_5$), titania ($TiO_2$), zirconia ($ZrO_2$), all of relatively pure grade (e.g., C.P. grade) are intimately mixed in a rubber-lined ball mill with distilled water. In milling the mixture, care should be exercised to avoid, or the proportions of ingredients varied to compensate for, contamination by wear of the milling ball or stones.

Following the wet milling, the mixture is dried and mixed to assure as homogeneous a mixture as possible. Thereafter, the mixture is suitably formed into a desired form at a pressure of 400 kg./cm.$^2$. The compacts are pre-reacted by calcination at a temperature of around 850° C. for 2 hours.

After calcination, the reacted material is allowed to cool and is then wet milled to a small particle size. Once again, care should be exercised to avoid, or the proportions of ingredients varied to compensate for, contamination by wear of the milling balls or stones. Depending on preference and the shapes desired, the material is formed into a mix or slip suitable for pressing, slip casting, or extruding, as the case may be, in accordance with per se conventional ceramic procedures. The samples for which data are given hereinbelow were prepared by mixing 100 grams of the milled pre-sintered mixture with 5 cc. of distilled water. The mix was then pressed into discs of 20 mm. diameter and 2 mm. thickness at a pressure of 700 kg./cm.$^2$. The pressed discs are fired at 1200–1240° C. for 45 minutes of heating period. According to the present invention, there is no need to fire the composition in an atmosphere of $PbO$ and no special care is required for the temperature gradient in the furnace, compared with the prior art. Thus, according to the present invention, uniform and excellent piezoelectric ceramic products can be easily obtained simply by covering the samples with an alumina crucible during firing.

The sintered ceramics are polished on both surfaces to the thickness of one millimeter. The polished disc surfaces are then coated with silver paint and fired to form silver electrodes. Finally, the discs are polarized while immersed in a bath of silicone oil at 100° C. A voltage gradient of D-C 4 kv. per mm. is maintained for one hour, and the discs are field-cooled to room temperature in thirty minutes.

The piezoelectric and dielectric properties of the polarized specimens have been measured at 20° C. in a relative humidity of 50% and at a frequency of 1 kc. Examples of specific ceramic compositions according to this invention and various pertinent electromechanical and dielectric properties thereof are given in Table I. From Table I, it will be readily evident that the exemplary compositions selected from the area bounded by lines connecting points A, B, C, D and E of the diagram of FIG. 2 are characterized by high dielectric constant along with high planar coupling coefficient. Especially, the compositions in the area of the diagram bounded by lines connecting points F, G, H, I, J, K and L, FIG. 2, exhibit a planar coupling coefficient of approximately 0.5 or higher along with high dielectric constant.

TABLE I

| Example Number | Mole percent of composition | | | 24 hours after poling | |
|---|---|---|---|---|---|
| | $Pb(Cu_{1/4}Nb_{3/4})O_3$ | $PbTiO_3$ | $PbZrO_3$ | Planar coupling Coefficient, Kp at 20° C. | Dielectric constant, at 1 kc. |
| 1 | 25.0 | 37.5 | 37.5 | 0.21 | 2,210 |
| 2 | 12.5 | 75.0 | 12.5 | 0.20 | 400 |
| 3 | 12.5 | 46.5 | 41.0 | 0.53 | 1,330 |
| 4 | 12.5 | 43.5 | 44.0 | 0.63 | 1,630 |
| 5 | 12.5 | 40.5 | 47.0 | 0.61 | 1,280 |
| 6 | 12.5 | 37.5 | 50.0 | 0.56 | 970 |
| 7 | 12.5 | 12.5 | 75.0 | 0.21 | 420 |
| 8 | 9.0 | 50.0 | 41.0 | 0.51 | 730 |
| 9 | 8.5 | 37.5 | 54.0 | 0.50 | 690 |
| 10 | 6.0 | 43.0 | 51.0 | 0.62 | 980 |
| 11 | 3.0 | 50.0 | 47.0 | 0.54 | 790 |
| 12 | 3.0 | 43.0 | 54.0 | 0.56 | 600 |
| 13 | 1.0 | 69.0 | 30.0 | 0.21 | 240 |
| 14 | 1.0 | 47.0 | 52.0 | 0.53 | 750 |
| 15 | 1.0 | 29.0 | 70.0 | 0.22 | 300 |

According to Table I the values of planar coupling coefficient and dielectric constant can be adjusted to suit various applications by appropriately selecting the composition.

From Table II it will be evident that the piezoelectric ceramics of this invention exhibit high planar coupling coefficient (Kp) at high temperature. Therefore, the ceramics of the invention are suitable for transducer elements to be used at relatively high temperature.

TABLE II

| Example Number | Kp at 20° C. | Kp at 180° C. | Kp at 240° C. |
|---|---|---|---|
| 4 | 0.63 | 0.63 | 0.56 |
| 10 | 0.62 | 0.62 | 0.57 |

The piezoelectric ceramic composition, $$Pb(Cu_{1/4}Nb_{3/4})_{0.125}Ti_{0.405}Zr_{0.470}O_3$$

exhibits high stability of resonant frequency with temperature. The change in resonant frequency is 0.05% within the range 20 to 85° C. This property is important to the use of piezoelectric composition in filter applications.

According to the present invention, the piezoelectric ceramics exhibit high electromechanical coupling coefficient and high stability of resonant frequency with temperature. Therefore, the ceramics of the invention are suitable for use in electromechanical transducer elements such as phonograph pick-ups, microphones, filters and voltage generators in ignition systems.

In addition to the superior properties shown above, the compositions according to the present invention yield ceramics of good physical quality and which polarize well. It will be understood from the foregoing that the ternary ceramics $Pb(Cu_{1/4}Nb_{3/4})O_3$—$PbTiO_3$—$PbZrO_3$ form an excellent piezoelectric ceramic body.

What is claimed is:

1. A piezoelectric ceramic composition consisting essentially of a solid solution of a material selected from the area bounded by lines connecting A, B, C, D and E of the diagram of FIG. 2, wherein A, B, C, D and E respectively have the following formulae:

A. $Pb(Cu_{1/4}Nb_{3/4})_{0.250}Ti_{0.375}Zr_{0.375}O_3$
B. $Pb(Cu_{1/4}Nb_{3/4})_{0.125}Ti_{0.750}Zr_{0.125}O_3$
C. $Pb(Cu_{1/4}Nb_{3/4})_{0.010}Ti_{0.690}Zr_{0.300}O_3$
D. $Pb(Cu_{1/4}Nb_{3/4})_{0.010}Ti_{0.290}Zr_{0.700}O_3$
E. $Pb(Cu_{1/4}Nb_{3/4})_{0.125}Ti_{0.125}Zr_{0.750}O_3$

2. A piezoelectric ceramic composition consisting essentially of a solid solution of a material selected from the area bounded by lines connecting points F, G, H, I, J, K and L of the diagram of FIG. 2, wherein F, G, H, I, J, K and L respectively have the following formulae:

F. $Pb(Cu_{1/4}Nb_{3/4})_{0.125}Ti_{0.465}Zr_{0.410}O_3$
G. $Pb(Cu_{1/4}Nb_{3/4})_{0.090}Ti_{0.500}Zr_{0.410}O_3$
H. $Pb(Cu_{1/4}Nb_{3/4})_{0.030}Ti_{0.500}Zr_{0.470}O_3$
I. $Pb(Cu_{1/4}Nb_{3/4})_{0.010}Ti_{0.470}Zr_{0.520}O_3$
J. $Pb(Cu_{1/4}Nb_{3/4})_{0.030}Ti_{0.430}Zr_{0.540}O_3$
K. $Pb(Cu_{1/4}Nb_{3/4})_{0.085}Ti_{0.375}Zr_{0.540}O_3$
L. $Pb(Cu_{1/4}Nb_{3/4})_{0.125}Ti_{0.375}Zr_{0.500}O_3$

3. An electromechanical transducer element consisting essentially of a piezoelectric ceramic composition as claimed in claim 2.

4. A piezoelectric ceramic material consisting of the solid solution having the following formula:

$$Pb(Cu_{1/4}Nb_{3/4})_{0.125}Ti_{0.405}Zr_{0.470}O_3$$

References Cited

UNITED STATES PATENTS

| | | | |
|---|---|---|---|
| 3,268,453 | 8/1966 | Ouchi et al. | 252—62.9 |
| 3,400,076 | 9/1968 | Ouchi et al. | 252—62.9 |
| 3,403,103 | 9/1968 | Ouchi et al. | 252—62.9 |

TOBIAS E. LEVOW, Primary Examiner

J. COOPER, Assistant Examiner

U.S. Cl. X.R.

106—39